United States Patent
Jang et al.

(10) Patent No.: US 9,852,256 B2
(45) Date of Patent: Dec. 26, 2017

(54) METHOD OF MANUFACTURING SEMICONDUCTOR DEVICE

(71) Applicant: SAMSUNG ELECTRONICS CO., LTD., Suwon-si, Gyeonggi-do (KR)

(72) Inventors: Myung-Soo Jang, Seoul (KR); Jae-Hwan Kim, Seoul (KR); Cheol-Jon Jang, Seoul (KR); Ji-Ho Song, Seoul (KR); Jong-Wha Chong, Seoul (KR); Kyung-In Cho, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 552 days.

(21) Appl. No.: 14/450,337

(22) Filed: Aug. 4, 2014

(65) Prior Publication Data

US 2015/0118793 A1    Apr. 30, 2015

(30) Foreign Application Priority Data

Oct. 25, 2013  (KR) .......................... 10-2013-0127868

(51) Int. Cl.
*G06F 17/50* (2006.01)
*H01L 21/768* (2006.01)

(52) U.S. Cl.
CPC .... *G06F 17/5077* (2013.01); *H01L 21/76898* (2013.01)

(58) Field of Classification Search
CPC ...................... G06F 17/5077; H01L 21/76898
See application file for complete search history.

(56) References Cited

U.S. PATENT DOCUMENTS

| 7,949,984 | B2 | 5/2011 | Tanamoto et al. |
| 8,006,212 | B2 | 8/2011 | Sinha et al. |
| 8,239,809 | B2 | 8/2012 | Fujita |
| 2011/0215457 | A1* | 9/2011 | Park .................... H01L 23/3677 257/686 |
| 2012/0110536 | A1 | 5/2012 | Agarwal et al. |
| 2013/0074027 | A1 | 3/2013 | Kimura |
| 2013/0097574 | A1* | 4/2013 | Balabanov .......... G06F 17/5072 716/123 |

FOREIGN PATENT DOCUMENTS

| JP | 2011-181868 | 9/2011 |
| KR | 1020090011013 A | 1/2009 |
| KR | 10-0919860 | 9/2009 |

\* cited by examiner

*Primary Examiner* — Vuthe Siek
*Assistant Examiner* — Aric Lin
(74) *Attorney, Agent, or Firm* — Volentine & Whitt, PLLC

(57) ABSTRACT

A method for manufacturing a semiconductor device can reduce congestion across wires while reducing a wire length. The method includes determining a first TSV candidate region in a first die and determining a second TSV candidate region in a second die parallel to the first die. The method also includes determining a first bound region. The first bound region includes a horizontal location of a first pin of the first die and a horizontal location of a second pin of the second die. The method additionally includes calculating an area from overlapped regions between the first bound region and each of the first TSV candidate region and the second TSV candidate region, and performing routing for connecting the first pin and the second pin to each other based on the calculated area.

14 Claims, 18 Drawing Sheets

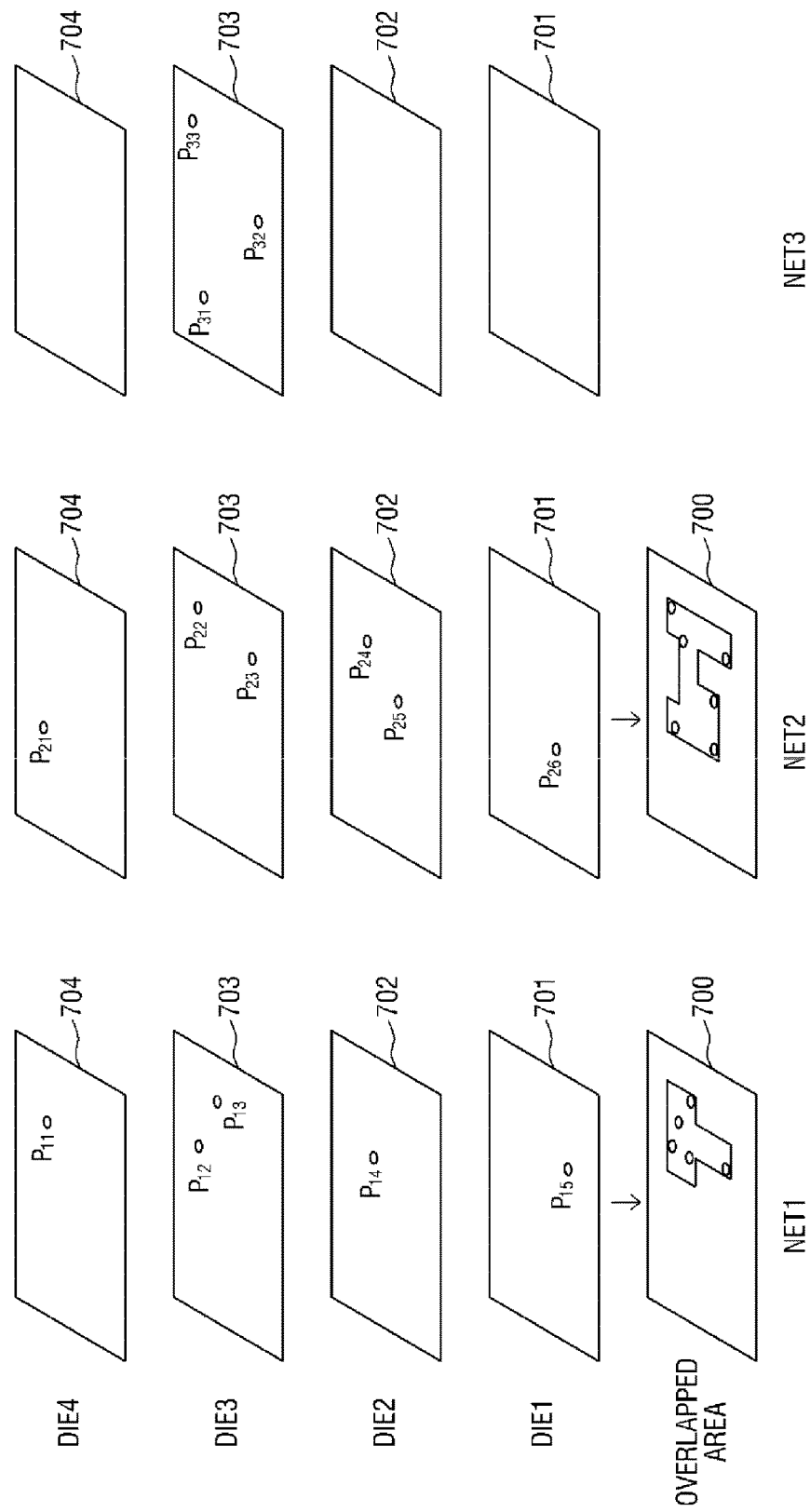

1000

METHOD OF MANUFACTURING SEMICONDUCTOR DEVICE

PRIORITY STATEMENT

This application claims priority from Korean Patent Application No. 10-2013-0127868 filed on Oct. 25, 2013 in the Korean Intellectual Property Office, and all the benefits accruing therefrom under 35 U.S.C. 119, and the contents of which are hereby incorporated by reference in their entirety.

BACKGROUND

1. Field of the Inventive Concept

The present inventive concept relates to a method of manufacturing a semiconductor device.

2. Description of the Related Art

Multi-chip modules are being developed to increase the degree of integration of circuitry in electronic devices. One class of these modules under development includes a three-dimensional (3D) integrated circuit in which several dies are stacked. TSV (Through-Silicon Via) technology, comprising a combination of through silicon vias (TSVs) and wires, may be used to electrically connect the various dies to each other. That is, the TSVs and wires provide the routing of signals between the different dies of the 3D integrated circuit.

SUMMARY

According to an aspect of the inventive concept, there is provided a method of manufacturing a semiconductor device, which includes determining a TSV candidate region in a first die and determining a WV candidate region in a second die parallel to the first die. The method also includes determining a first bound region horizontally encompassing a location of a pin of the first die and a location of a pin of the second die. The method additionally includes calculating an area based on areas of overlap, as viewed in plan, between the first bound region and each of the first TSV candidate region and the second TSV candidate region. The method also includes fabricating a semiconductor device having the first and second dies stacked on each other, through silicon vias (TSVs) electrically connected to the first and second dies, respectively, and the first pin and the second pin connected to one of the TSVs based on the calculated area.

According to another aspect of the present inventive concept, there is provided a method of manufacturing a semiconductor device, which includes determining a TSV candidate region in each of a plurality of dies, wherein each of the TSV candidate regions is a region available in the die for connection to through silicon vias (TSVs), determining a bound region for each of a plurality of nets, wherein each of the nets includes the pins which are to be electrically connected in common to one of the TSVs, and each of the bound regions is a region encompassing a projection of the locations of the pins constituting a respective one of the nets, calculating areas of overlap, as viewed in plan, between the bound region the TSV candidate regions, respectively, for each of the nets, determining a routing order of the nets based on the areas of overlap calculated for the nets, routing the pins of the nets with the TSVS in the routing order, and fabricating a 3D integrated circuit having a stack of dies including pins, and TSVs electrically connecting respective ones of the dies to each other and to which the pins are electrically connected in conformance with the routing order.

According to still another aspect of the present inventive concept, there is provided a method of manufacturing a semiconductor device, which includes determining N TSV candidate regions for N dies having a plurality of pins and stacked in a vertical direction, where N is an integer greater than or equal to 2, determining a first bound region horizontally encompassing locations of pins of a first net and a second bound region horizontally encompassing pins of a second net, calculating a first area by summing all areas of overlap, as viewed in plan, between the first bound region and the N TSV candidate regions, and assigning the first area to the first net, calculating a second area by summing all areas of overlap, as viewed in plan, between the second bound region and the N TSV candidate regions, and assigning the second area to the second net, routing the nets with TSVs in an order based on their assigned areas, and fabricating a 3D integrated circuit having a stack of dies including pins, and TSVs electrically connecting respective ones of the dies to each other and to which the pins are electrically connected in conformance with the routing order.

BRIEF DESCRIPTION OF THE DRAWINGS

The above and other features and advantages of the present inventive concept will become more apparent from the detailed description of the preferred embodiments thereof that follows, with reference to the attached drawings in which:

FIG. 9 schematically illustrates determination of routing order of a plurality of nets;

DETAILED DESCRIPTION OF THE PREFERRED EMBODIMENTS

Figure 1:
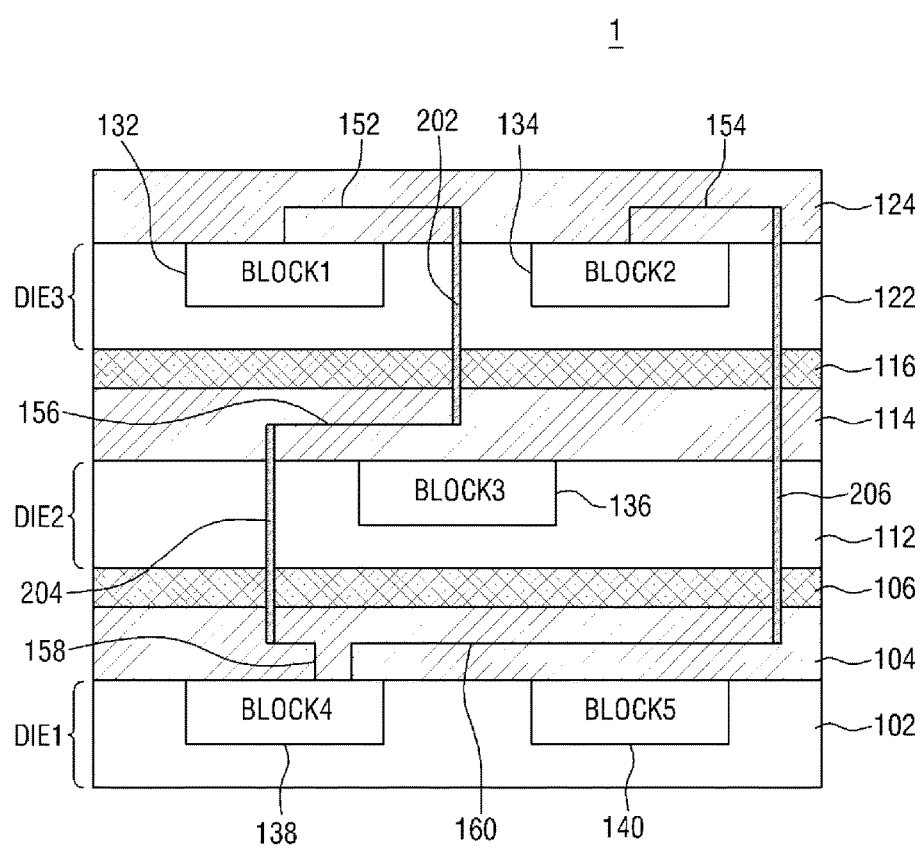
FIG. 1 is a schematic diagram of a semiconductor device fabricated according to the present inventive concept.

Various embodiments and examples of embodiments of the inventive concept will be described more fully hereinafter with reference to the accompanying drawings. In the drawings, the sizes and relative sizes and shapes of elements, layers and regions, such as implanted regions, shown in section may be exaggerated for clarity. In particular, the cross-sectional illustrations of the semiconductor devices and intermediate structures fabricated during the course of their manufacture are schematic. Also, like numerals are used to designate like elements throughout the drawings.

It will also be understood that when an element or layer is referred to as being "on" or "connected to" another element or layer, it can be directly on or directly connected to the other element or layer or intervening elements or layers may be present. In contrast, when an element or layer is referred to as being "directly on" or "directly connected to" another element or layer, there are no intervening elements or layers present.

Other terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes. The terms "horizontal" or "horizontally" and "vertical" or "vertically" will refer for purposes of description only to an orientation in which the planes of the dies are oriented horizontally with the dies stacked in the vertical direction.

An example of a semiconductor device fabricated according to the present inventive concept will now be described with reference to FIG. 1.

The semiconductor device 1 includes a plurality of dies 102, 112 and 122 arranged in a vertical direction. Electronic device blocks 132, 134, 136, 138 and 140 may be formed in (substrates of) the respective dies 102, 112 and 122. For example, the electronic device blocks 138 and 140 may be formed in the die 102, the electronic device block 136 may be formed in the die 112, and the electronic device blocks 132 and 134 may be formed in the die 122. Each of the electronic device blocks includes an electronic circuit(s) or component(s).

Metal routing layers 104, 114 and 124 and insulation layers 106 and 116 may be interposed between the vertically arranged plurality of dies 102, 112 and 122. The metal routing layers 104, 114 and 124 may include a conductive material, for example, a metal. Examples of the metal include aluminum (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), renium (Re), ruthenium (Ru), tantalum (Ta), tellium (Te), titanium (Ti), tungsten (W), zinc (Zn), and zirconium (Zr), but not limited thereto. The insulation layers 106 and 116 may include an oxide, nitride, or oxynitride. Specifically, the insulation layers 106 and 116 may include silicon oxide, silicon nitride, or silicon oxynitride.

The metal routing layers 104, 114 and 124 and the insulation layers 106 and 116 may be formed by chemical vapor deposition (CVD), plasma enhanced chemical vapor deposition (PECVD), high density plasma chemical vapor deposition (HDP-CVD), sputtering, metal organic chemical vapor deposition (MOCVD), or atomic layer deposition (ALD), but the inventive concept is not limited thereto.

The electronic device blocks 132, 134, 136, 138 and 140 are electrically connected to each other through through-silicon vias (TSVs) 202, 204 and 206 passing through the metal routing layers 104, 114 and 124 and the insulation layers 106 and 116. For example, the electronic device block 132 formed in the die 122 and the electronic device block 138 formed in the die 102 are electrically connected to each other through the TSVs 202 and 204 wires 152, 156 and 158. Likewise, the electronic device block 134 formed in the die 122 and the electronic device block 138 formed in the die 102 are electrically connected to each other through the TSV 206 and wires 154 and 160.

An embodiment of a method of fabricating a semiconductor device, such as the example of the semiconductor device 1 described above, according to the present inventive concept will be described with reference to the flowchart of FIGS. 2A and 2B.

Figure 2A:
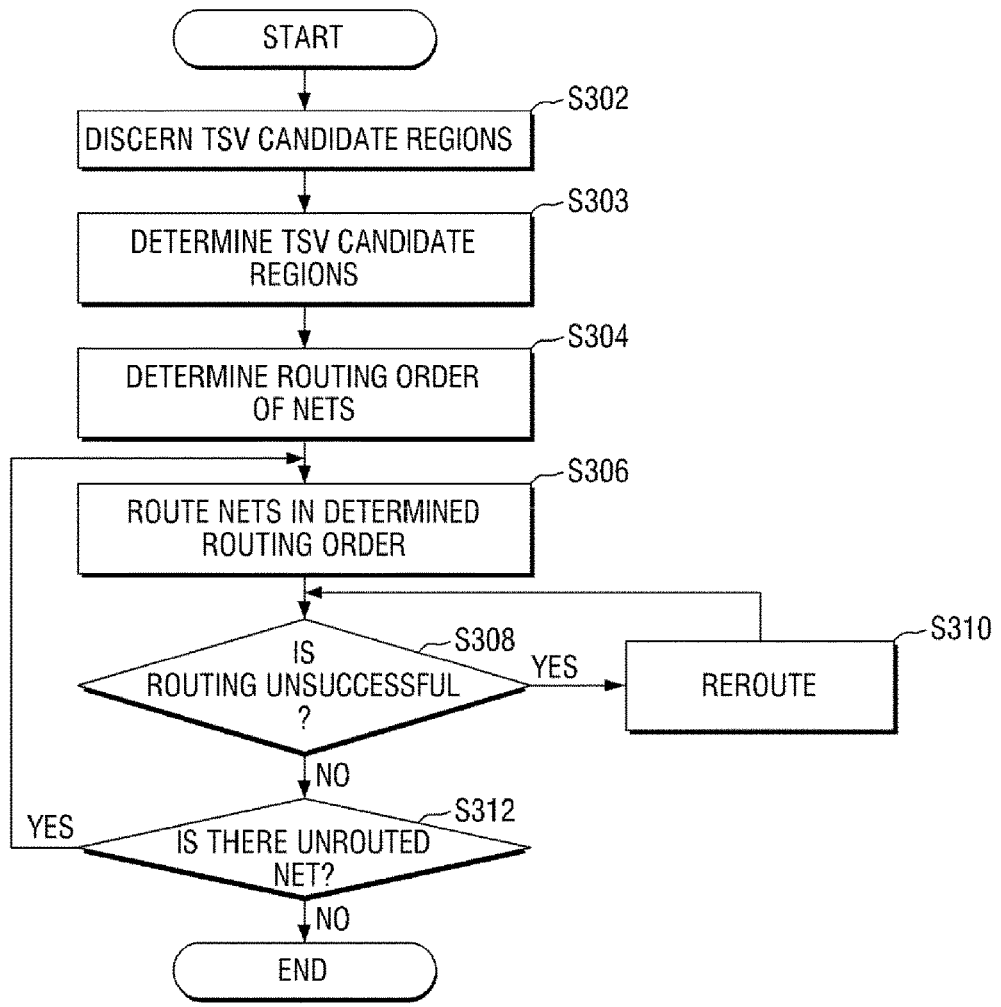
FIG. 2A is a flowchart illustrating an embodiment of a method of fabricating a semiconductor device, according to the present inventive concept.

Referring first to FIG. 2A, the method includes securing TSV candidate regions in dies 102, 112 and 122 (S302). The TSV candidate regions are regions of the dies 102, 112 and 122 where TSVs can be formed. For example, the TSV candidate regions are regions of the dies 102, 112 and 122 that will not be occupied by the electronic device blocks 132, 134, 136, 138 and 140, because the TSVs cannot overlap the electronic device blocks 132, 134, 136, 138 and 140 in the final device. More specifically, a layout of the electronic device blocks 132, 134, 136, 138 and 140 is produced by appropriately apportioning or "evenly" distributing the regions without the electronic device blocks 132, 134, 136, 138 and 140 in the dies 102, 112 and 122 to secure spaces for forming TSVs, as will be described later in more detail with reference to FIGS. 3A to 4B. Next, the secured regions are determined to be, i.e., are designated as, the TSV candidate regions (S303).

Then, a routing order of a plurality of nets (S304) is determined. Each of the nets includes electrical pin connections (referred to hereinafter simply as "pins") of one die and pins of another die(s), and the wires in each of those dies which electrically connect the pins in the die to each other (as will be described in more detail with reference to FIGS. 5A and 5B). Referring again to FIG. 1, the electronic device block 132 formed in the die 122 and the electronic device block 138 formed in the die 102 are electrically connected to each other by a net, and the electronic device block 134 formed in the die 122 and the electronic device block 138 formed in the die 102 are electrically connected to each other by another net. The connections of the nets to the TSVs are determined to minimize the total length of wiring of the semiconductor device 1.

The nets are routed in the determined routing order to minimize the length of wiring (S306). Routing in this respect (i.e., in respect to S304, 306) includes determining an order in which the nets are connected to the TSVs (referred to hereinafter as the "routing order"), and laying out the paths of horizontal wiring between the pins of each net based on the location of the TSV to which they are to be connected. In an embodiment of a method of manufacturing a semiconductor device according to the present inventive concept, the routing is performed using a minimum spanning tree such that the distances between the pins of each net and congestion costs of the TSV candidate regions are minimized, which will later be described in detail.

Meanwhile, a determination is made as to whether the routing is successful (S308). If the routing is unsuccessful, re-routing is performed (S310), and if the routing is successful, any unrouted nets are routed (S312).

That is, an iteration is performed to determine a correlation between the nets and TSVs which allows for the pins of the nets to be connected using the least amount of wiring.

Figure 2B:
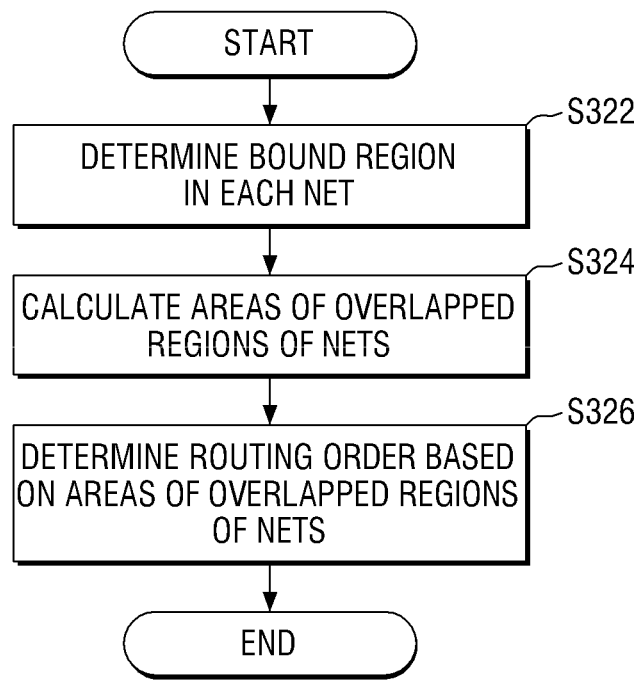
FIG. 2B is a flowchart of a process of determining the routing order in the method of FIG. 2A.

Referring to FIG. 2B, the determining of the routing order of the plurality of nets (S304) includes determining a bound region for each of the plurality of nets (S322), calculating areas of overlapping regions between the TSV candidate regions and the bound regions for the plurality of nets (S324), and determining the routing order of the plurality of nets based on the calculated areas of the overlapping regions (S326).

Hereinafter, a detailed example of one process of determining a layout of the TSV candidate regions (S303) will be described with reference to FIGS. 3A to 4B.

Figure 3A:
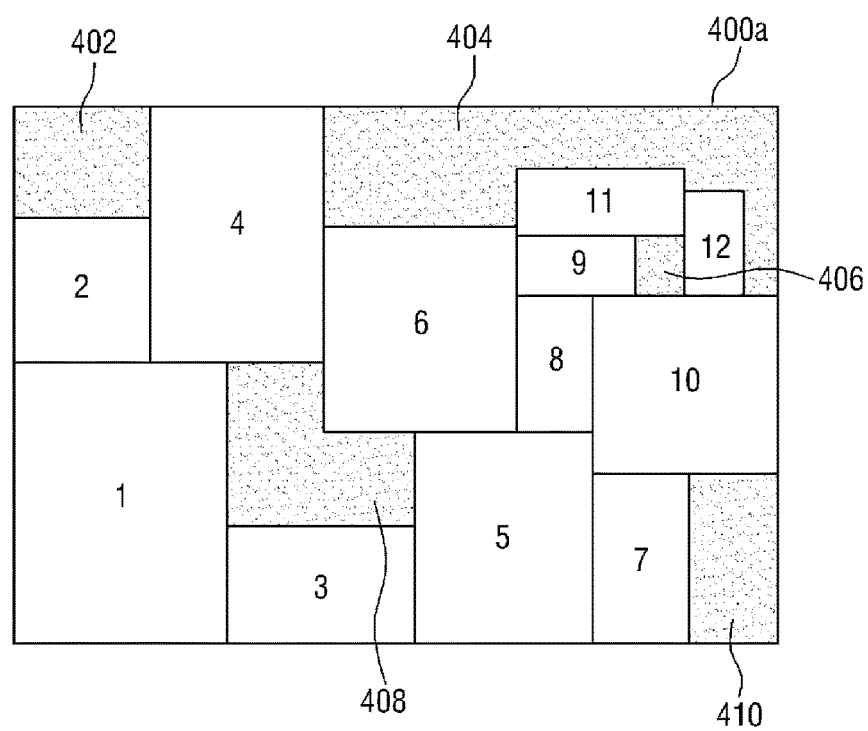
FIGS. 3A and 3B schematically illustrate a process of determining a layout of TSV candidate regions.
Figure 3B:
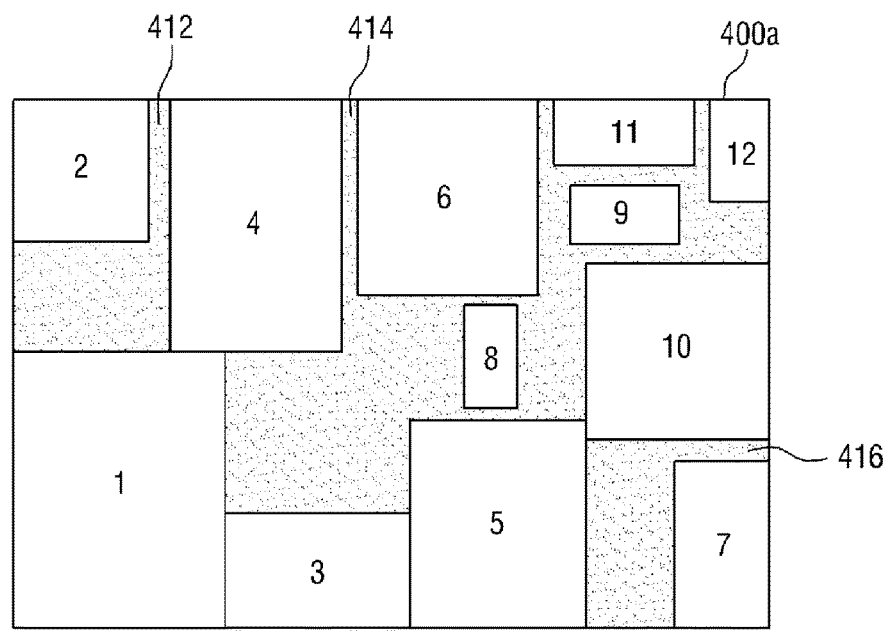

Referring to FIG. 3A, a plurality of electronic device blocks 1-10 are laid out in a die 400a, and regions without the electronic device blocks are considered for their suitability as TSV candidate regions 402, 404, 406, 408 and 410. That is to say, TSVs may be formed in the TSV candidate regions 402, 404, 406, 408 and 410 because the electronic device blocks are not laid out in the TSV candidate regions 402, 404, 406, 408 and 410. However, some of the electronic device blocks shown in FIG. 3A are densely arranged in a predetermined region such that a space for forming TSVs is not available around one or more of the blocks, e.g., around a block 8. Therefore, it is necessary to rearrange the electronic device blocks to determine (a layout of) the TSV candidate regions (S303). FIG. 3B illustrates the TSV candidate regions 412, 414 and 416 determined by rearranging the electronic device blocks. In determining the TSV candidate regions, the electronic device blocks 1-10 are spaced such that the regions in which TSVs can be formed are evenly distributed in the die 400a.

Figure 4A:
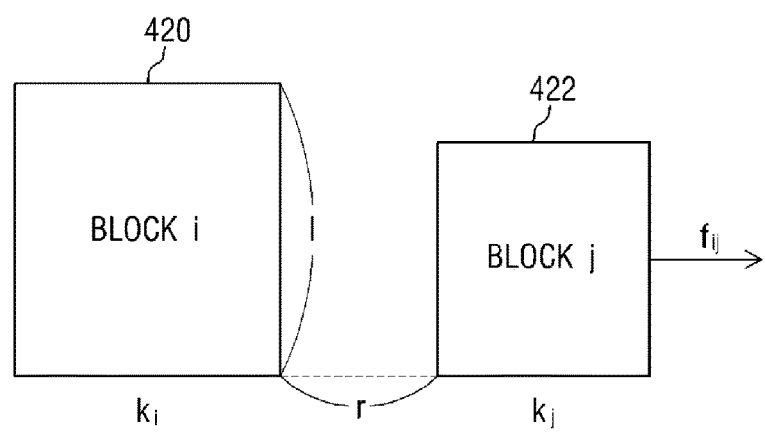
FIGS. 4A and 4B schematically illustrate a process of arranging electronic device blocks to produce a layout of the TSV candidate regions.
Figure 4B:
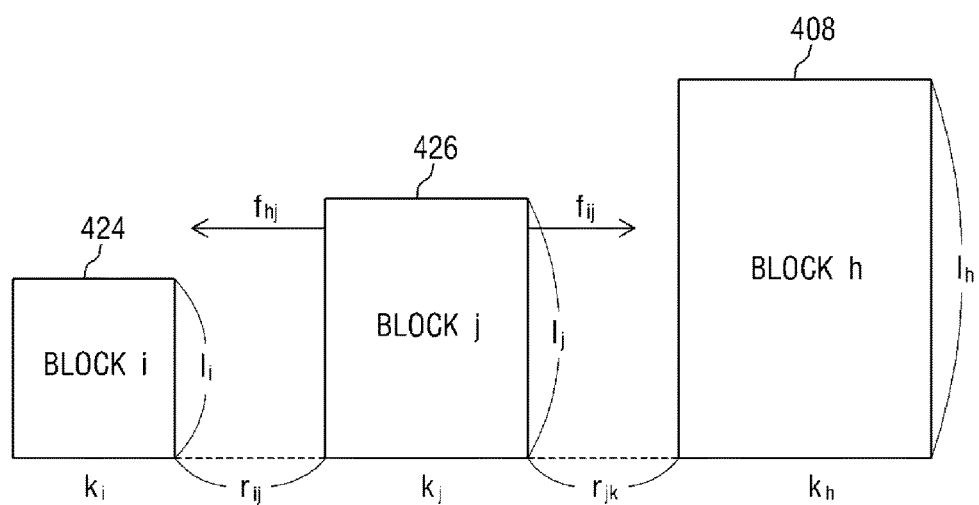

FIGS. 4A and 4B schematically illustrate an example of a process used to rearrange the electronic device blocks for determining TSV candidate regions.

To secure spaces between the electronic device blocks in the die, a force-directed technique may be adopted. More specifically, assuming that repulsive forces exist in the electronic device blocks in four orthogonal directions in the plane of the die (up, down, left and right in the views of FIGS. 3A and 3B), distances between the electronic device blocks are determined based on magnitudes of repulsive forces assumed to exist between the electronic device blocks. The repulsive force can be computed by Equations (1) and (2):

$$f(i,j)=1\times(a\times k_i\times b\times k_j)/r^2, \text{ where } r \text{ is not } 0 \quad (1)$$

$$f(i,j)=2\times l\times(a\times k_i\times b\times k_j), \text{ where } r \text{ is } 0 \quad (2)$$

where f(i, j) is a function of the magnitude of the repulsive force between an ith electronic device and a jth electronic device, l is the effective distance between the ith electronic device and the jth electronic device, r is the actual distance between the ith electronic device and the jth electronic device, $k_i$ is the number of TSVs required by the ith electronic device, $k_j$ is the number of TSVs required by the kth electronic device, and a and b are constants greater than or equal to 0.

Referring to FIG. 4A, the repulsive force ($f_{ij}$) between blocks i and j is computed by the actual distance r between the blocks i and j, the effective distance l between the blocks i and j, and values $k_i$ and $k_j$ proportional to the numbers of TSVs required by the blocks i and j, respectively. In FIG. 4A, the repulsive force ($f_{ij}$) acts in the right-hand direction of the block j, suggesting that the block j should be shifted rightward in order to secure a space for forming a TSV.

Meanwhile, referring to FIG. 4B, the block j is simultaneously subjected to the repulsive force ($f_{hj}$) acting in the left-hand direction of the block j and the repulsive force ($f_{ij}$) acting in the right-hand direction of the block j. Here, the repulsive force ($f_{hj}$) is a force applied to the block j associated with the block i, and the repulsive force ($f_{ij}$) is a force applied to the block j associated with the block h. If the magnitude of the repulsive force ($f_{hj}$) is greater than that of the repulsive force ($f_{ij}$), the block j should be shifted leftward in accordance with the magnitude of the repulsive force obtained by subtracting the repulsive force ($f_{ij}$) from the repulsive force ($f_{hj}$). The relationship between the magnitude of repulsive force and the distance a block is shifted in a die may be set without limitation depending on the environment in which semiconductor devices according to various embodiments of the present inventive concept are actually implemented.

Figure 5A:
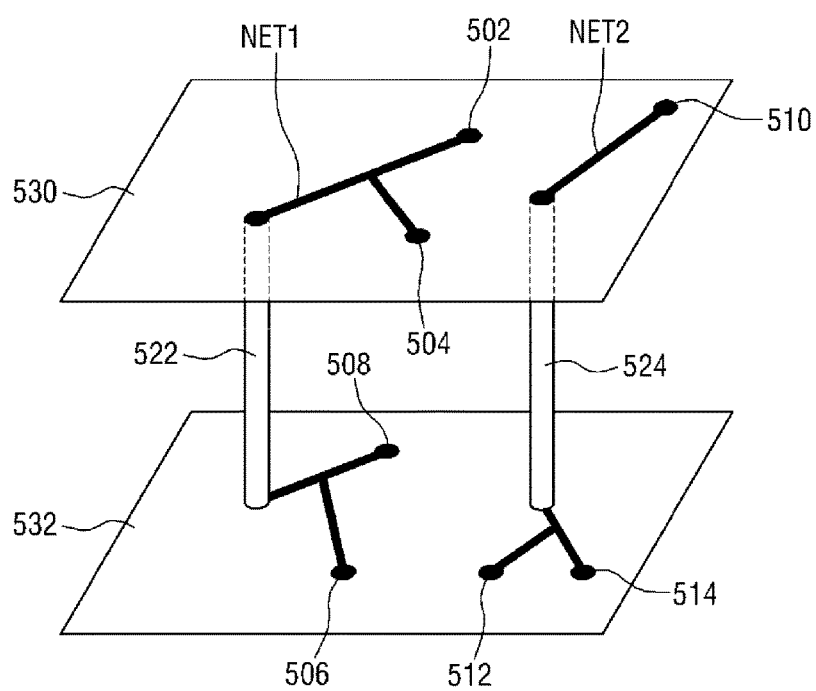
FIGS. 5A and 5B schematically illustrate different routing orders for the same nets.
Figure 5B:
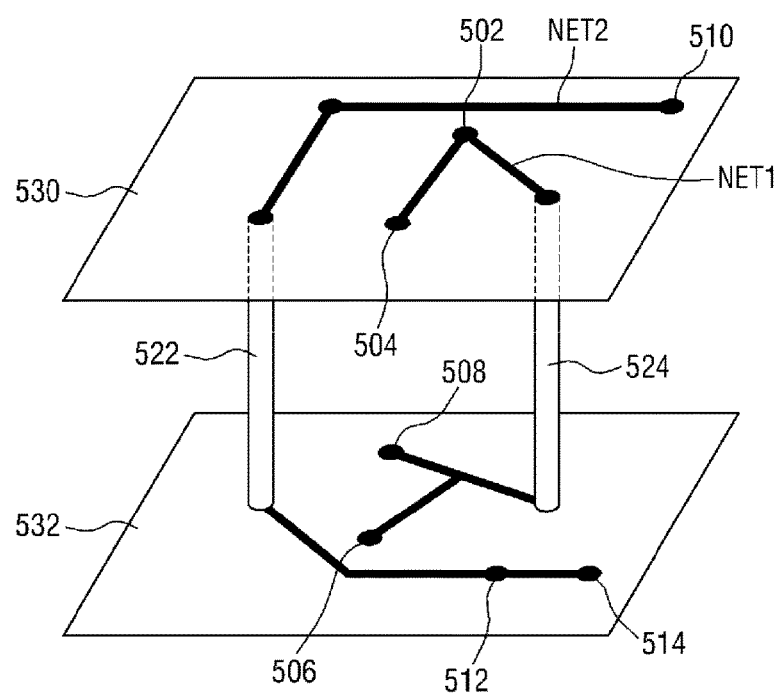

FIGS. 5A and 5B schematically illustrate the results of routing the same nets in different orders.

In each of FIGS. 5A and 5B, a first net NET1 includes a plurality of pins 502, 504, 506 and 508 of dies 530 and 532, and a second net NET2 includes a plurality of pins 510, 512 and 514 of dies 530 and 532. The routing order illustrated in FIG. 5A shows the second net NET2 routed first so as to be connected with the TSV 524 (the TSV 524 being the TSV closest to the second net NET2). If the second net NET2 is routed with the TSV 524, i.e., if the pins of the second net NET2 are electrically connected by the TSV 524, the unrouted pins, namely the pins of the first net NET1, cannot make use of the TSV 524. Accordingly, the first net NET1 will be routed second and therefore, will be connected with the TSV 522 instead of the TSV 524.

A different order of the routing of the first net NET1 and the second net NET2 is shown in FIG. 5B. This routing order shows the first net NET1 routed first so as to be connected with the TSV 524, i.e., the pins of the first net NET1 are electrically connected by the TSV 524. Thus, the unrouted pins, namely, the pins of the second net NET2, cannot make use of the TSV 524. Accordingly, the second net NET2 is connected with the TSV 522 instead of the TSV 524. In this case, the overall length of wires to connect the pin 510 and the pin 512 of the second net NET2 to each other is far greater than when the routing order shown in FIG. 5A is employed. According to an aspect of the present inventive concept, the routing order of the nets is determined to minimize the overall length of wires in the device 1.

Figure 6:
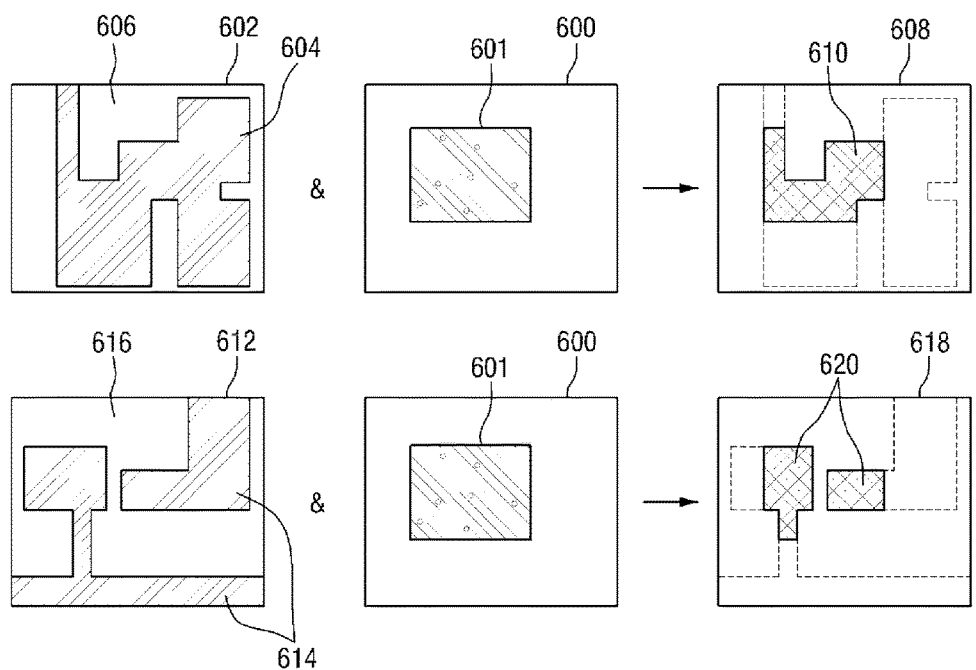
FIG. 6 schematically illustrates a process of calculating areas of overlapping regions between bound regions and TSV candidate regions.
Figure 7:
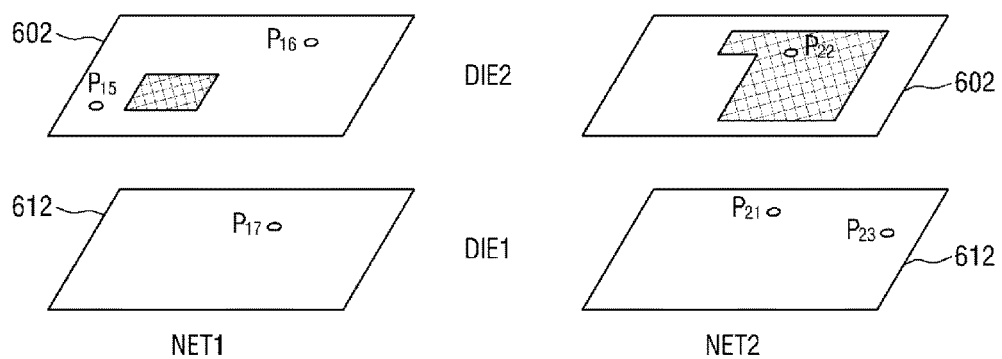
FIG. 7 schematically illustrates a process of determining a routing order based on the areas of overlapping regions between bound regions and TSV candidate regions.

FIG. 6 schematically illustrates a process of calculating areas of overlapping regions between bound regions and TSV candidate regions (S322 and S33 in FIG. 2B) and FIG. 7 schematically illustrates a process of determining a routing order based on the areas of overlapping regions between bound regions and TSV candidate regions (S326 in FIG. 2B).

Referring to FIG. 6, die 612 and die 602 are in parallel planes. That is, die 612 and die 602 are representative of dies shown herein, and are substantially disposed in parallel (i.e., non-intersecting) planes as shown. A first TSV candidate region 604 in a die 602 is determined, and a second TSV candidate region 614 in a die 612 parallel to (i.e., spaced vertically from) the die 602 is determined in the manner described with reference to FIGS. 4A and 4B. Subsequently, a bound region 601 is determined for a net including the pins of the dies 602 and 612. The bound region 601 encompasses, horizontally, all locations of the pins of the dies 602 and 612. The bound region 601 may be a polygon, for example, a rectangle. More specifically, the locations of the pins on the die 602 constituting a net are projected vertically onto a virtual horizontal plane 600, and the locations of the pins on the die 612 constituting the same net are also projected on the virtual plane, and the projected locations are circumscribed to produce the bound region 601. The region of overlap 610 between the first TSV candidate region 604 and the bound region 601 (as viewed in plan), and the region 620 of overlap (as viewed in plan) between the second TSV candidate region 614 and the bound region 601 (each region of overlap referred to hereinafter as an "overlapped region") are obtained. Areas of the overlapped regions 610 and 620 are then calculated.

The routing order can be determined based on the calculated areas of the overlapped regions for the plurality of nets. In an example of a method of manufacturing a semiconductor device according to the present inventive concept, the routing order is determined based on which net yields overlapped regions of the smallest area. For example, as shown in FIG. 7, if the total of the areas of the overlapped regions for the second net NET2 (as represented by the cross-hatched polygon) is greater than that of the areas of the overlapped regions for the first net NET1 (as also represented by the cross-hatched polygon), suggesting that the second net NET2 has more TSV candidates than the first net NET1, the first net NET1 having fewer TSV candidates is routed first (S306 in FIG. 2A). That is, for the TSV candidates competing with each other in the same bound region, the first net NET1 has priority in routing because the second net NET2 can make use of other TSV candidates in the bound region. Note, in FIG. 7, reference characters $P_{15}$, $P_{16}$ and $P_{17}$ designate (the locations of) the pins of the first net NET1, and reference characters $P_{21}$, $P_{22}$ and $P_{23}$ designate (the location of) the pins of the second net NET2.

Figure 8:
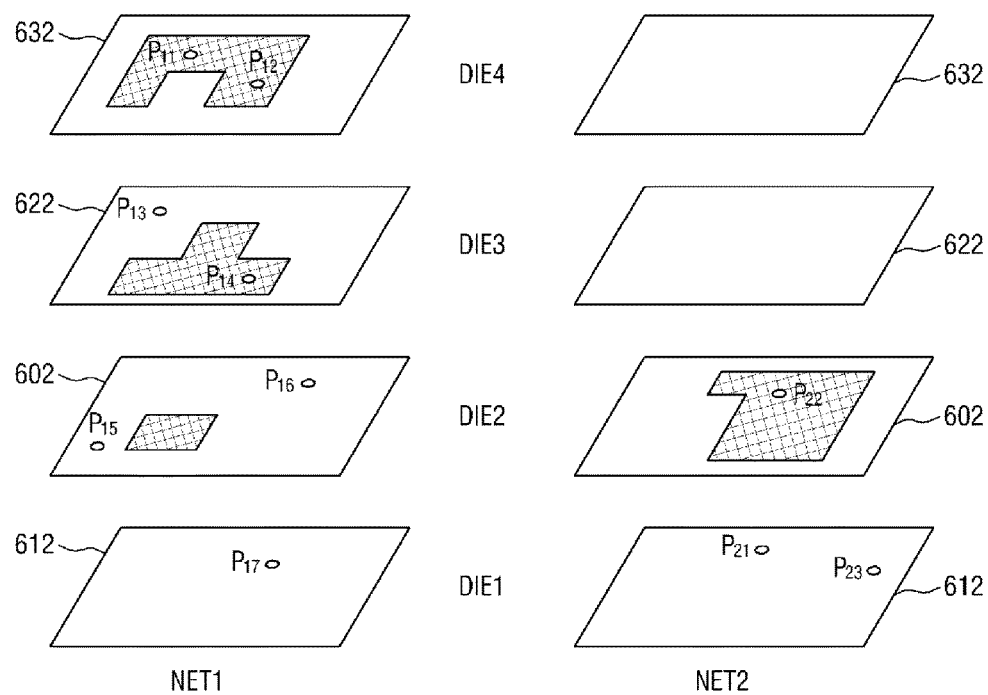
FIG. 8 schematically illustrates a process of determining a routing order based on the minimum area of overlapping regions between bound regions and TSV candidate regions.

FIG. 8 schematically illustrates another example of a process of determining a routing order based on the minimum area of regions of overlap between bound regions and TSV candidate regions.

In this example the routing order is determined such that among the plurality of nets, the net having a smaller value of Cost_net_ordering, as calculated by Equation (3), is first routed:

$$\text{Cost\_net\_ordering} = a \times \min(\text{overlapping\_area}) + b \times \text{total}(\text{overlapping\_area}) \quad (3)$$

where min(overlapping_area) is the minimum area among the areas of the overlapped regions of the net, total(overlapping_area) is the total of the areas of the overlapped regions, and a and b are constants greater than or equal to 0.

As described above, the routing order of the nets may be determined based on the areas of the overlapped regions. However, the process shown in and described with reference to FIG. 8 solves a problem that may arise when the routing order is determined just by the total of the areas of the overlapped regions. More specifically, in this example, the total of the areas of the overlapped regions for the first net NET1 is greater than that of the areas of the overlapping regions for the second net NET2. Therefore, the second net NET2 has priority in the routing order according to the process described above with reference to FIGS. 6 and 7. Nonetheless, the number of the TSV candidate regions that can be used by the first net NET1 may still be insufficient as shown in FIG. 7 between the die 602 and the die 612. Therefore, if the second net NET2 is first routed and the TSV candidate regions that can be used by the first net NET1 are preoccupied by the second net NET2 between the die 602 and the die 612, another path cannot be established for connecting unrouted pins of the first net NET1 between the die 602 and the die 612. In order to overcome the problem, in the process shown in FIG. 8 and using Equation (3), the minimum value of the areas of the overlapped regions is taken into consideration. As understood from Equation (3), a ratio of the total of the areas of the overlapped regions to the minimum value of the areas of the overlapped regions is adjusted by the constants a and b, and there are hardly any limitations on the designs of the semiconductor devices which can be fabricated according to the present inventive concept.

FIG. 9 schematically illustrates another example of a process of determining the routing order of a plurality of nets. In this example, the routing order is determined by classifying the nets whose pins are provided in at least two different dies as a first group, classifying the nets whose pins are provided in only one of the dies as a second group, and routing the nets belonging to the first group earlier than the nets belonging to the second group.

Referring to FIG. 9, a first net NET1 includes pins $P_{11}$, $P_{12}$, $P_{13}$, $P_{14}$, and $P_{15}$ on dies 701, 702, 703 and 704, a second net NET2 includes pins $P_{21}$, $P_{22}$, $P_{23}$, $P_{24}$, $P_{25}$, and $P_{26}$ on dies 701, 702, 703 and 704, and a third net NET3 includes pins $P_{31}$, $P_{32}$ and $P_{33}$ on only the die 703. The routing order of the first net NET1, the second net NET2 and the third net NET3 is determined in the following manner alluded to above. First, because the pins of the third net NET3 are disposed on the same die 703, it is not necessary for the pins of the third net NET3 to use TSVs. Therefore, the third net NET3 is routed later than the first net NET1 and the second net NET2.

The routing order of the first net NET1 and the second net NET2 is determined in the following manner. A first area is calculated by summing all the areas of overlapping regions between a first bound region including all horizontal locations of the pins $P_{11}$, $P_{12}$, $P_{13}$, $P_{14}$, and $P_{15}$ of the first net NET1 and the TSV candidate regions determined (S303 in FIG. 2A) for the dies 701, 702, 703 and 704. Likewise, a second area is calculated by summing all the areas of overlapping regions between a second bound region including all horizontal locations of the pins $P_{21}$, $P_{22}$, $P_{23}$, $P_{24}$, $P_{25}$, and $P_{26}$ of the second net NET2 and TSV candidate regions determined on the dies 701, 702, 703 and 704. As shown in FIG. 9, because the first overlapped area is smaller than the second overlapped area, the first net NET1 is routed earlier than the second net NET2. This process of FIG. 9 may be modified to incorporate the technique described with reference to FIG. 8, such that determining the routing also takes the minimum value of the areas of the overlapped regions into consideration as expressed in Equation (3).

Figure 10A:
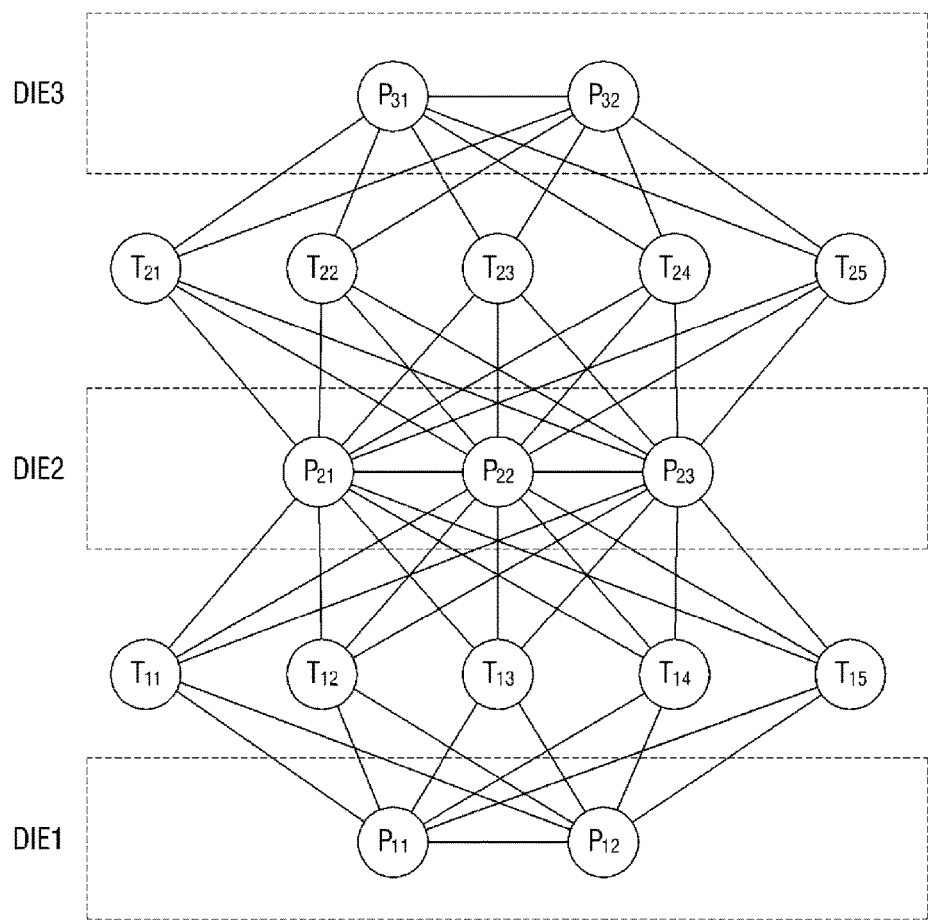
FIG. 10A schematically illustrates construction of a tree using pin nodes and TSV nodes to perform routing, and FIG. 10B schematically illustrates a minimum cost spanning tree constructed to perform routing.
Figure 10B:
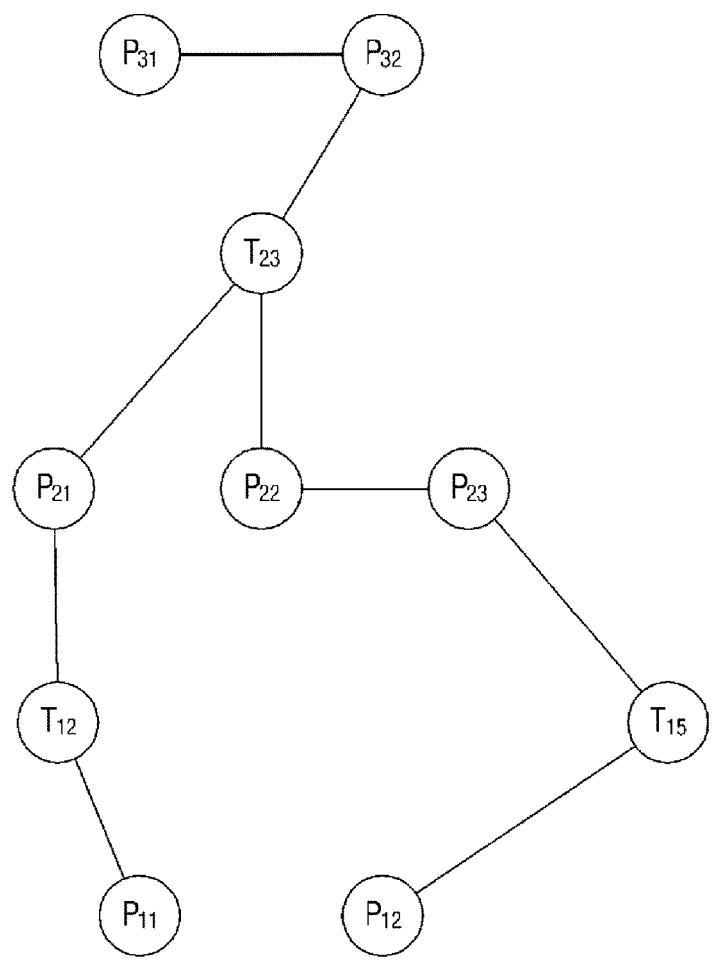

FIG. 10A schematically illustrates the construction of a tree using pin nodes and TSV nodes, and FIG. 10B schematically illustrates a minimum cost spanning tree constructed to determine the routing order (determined in S306).

Referring to FIG. 10A, a tree can be constructed from pin nodes representing pins and TSV nodes representing TSV candidates. Pin nodes $P_{11}$ and $P_{12}$ correspond to pins of a first die DIE1, pin nodes $P_{21}$, $P_{22}$ and $P_{23}$ correspond to pins of the second die DIE2, and pin nodes $P_{31}$ and $P_{32}$ correspond to pins of the third die DIE3. TSV nodes $T_{21}$, $T_{22}$, $T_{23}$, $T_{24}$ and $T_{25}$ correspond to TSV candidates between the third die DIE3 and the second die DIE2, and TSV nodes $T_{11}$, $T_{12}$, $T_{13}$, $T_{14}$ and $T_{15}$ correspond to TSV candidates between the second die DIE2 and the first die DIE1. The weights calculated using Equations (4) to (6) may be assigned to edges of the thus constructed tree:

$$\text{Congestion\_Cost} = (1/(1-C_k)) - 2 \quad (4)$$

where Congestion_Cost is the cost congestion of the TSV candidate regions, and $C_k$ is the ratio of the number of routed TSVs to the number of TSV candidates in the TSV candidate regions.

Congestion of TSV regions refers to a numerical value representing how concentrated signals transmitted along a wire path connected to TSV candidates will be. In an example of the present inventive concept, values of the Congestion_Cost when $C_k$<0.5 will be considered negligible (0) and infinite when $C_k$>=1 and are computed by Equation (4) when 0.5<=$C_k$<1.

$$Cost\_routing = a \times WL + b \times CC \quad (5)$$

where Cost_routing is the weight assigned to each of the first edge and the third edge, WL is the wire length between pins, CC is the cost congestion of the TSV candidate regions, and a and b are constants greater than or equal to 0.

$$Cost\_routing\_Etp = a \times (WL + c \times nTSV) + b \times (CC + CC\_TSV) \quad (6)$$

where Cost_routing_Etp is the weight assigned to the second edge, WL is the wire length between pins, nTSV is the number of the TSV candidates, CC is the cost congestion of the TSV candidate regions, CC_TSV is the cost congestion of the TSV candidates, and a and b are constants greater than or equal to 0. In an example of this process according to the present inventive concept, CC_TSV will be considered as infinite if the TSV candidates are occupied, and a value of 0 if not.

The weights computed by Equation (5) are assigned to an edge (e.g., an edge between pin nodes $P_{31}$ and $P_{32}$) indicating connection between pins on the same die and an edge (e.g., an edge between a TSV node $T_{25}$ and a pin node $P_{21}$) indicating connection between a bottom portion of the TSV and a pin connected to the bottom portion of the TSV, among the edges of a tree. Meanwhile, weights computed by Equation (6) are assigned to an edge (e.g., an edge between a pin node $P_{32}$ and a TSV node $T_{25}$) indicating connection between a top portion of the TSV and an upper pin connected to the top portion of the TSV, among the edges of a tree.

Referring to FIG. 10B, a minimum cost spanning tree is constructed in order to deduce a path having the minimum total of the weights assigned to the tree as described above with reference to FIG. 10A. The minimum cost spanning tree may be found using an algorithm, such as Kruskal's algorithm or Prim's algorithm. The path so deduced is determined as a routing path for the pertinent net.

Meanwhile, if the routing of a particular net is unsuccessful in that it does not allow for all of the respective nets to be routed, in some embodiments of the present inventive concept, a routing result of the most recently successfully routed net among the nets having an overlapping region overlapping with the overlapping region of the unsuccessfully routed net is deleted, and the most recently successfully routed net and the unsuccessfully routed net are re-routed (S308, 310 in FIG. 2A).

In addition, if the re-routing is continuously unsuccessful for a predetermined time, weights are recalculated by varying a ratio of the distance between the pins and the cost congestion of the TSV candidate regions, and the re-routing may be performed according to the recalculated weights.

Finally, once a successful routing order is determined a 3D integrated circuit such as that shown in FIG. 1 and whose wiring is laid out according to the routing order is fabricated.

Thus, according to the present inventive concept as described above, in a 3D integrated circuit including a plurality of dies, the routing through TSVs is made efficient. Accordingly, a 3D integrated circuit may be realized in which the signal congestion in wires and the length of the wires are minimized.

Figure 11:
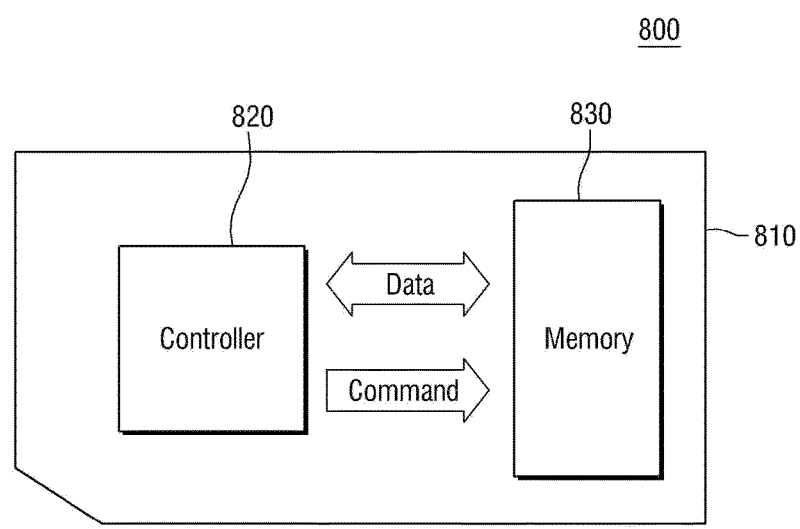
FIG. 11 schematically illustrates a memory card which may employ semiconductor packages fabricated according to the present inventive concept.

FIG. 11 schematically illustrates a memory card which employs a 3D integrated circuit (semiconductor device) fabricated according to the present inventive concept.

Referring to FIG. 11, the memory card 800 may include a controller 820 and a memory 830 provided in a housing 810. The controller 820 and the memory 830 may exchange electrical signals. For example, the memory 830 and the controller 820 may exchange data in accordance with an instruction from the controller 820. Accordingly, the memory card 800 may store data in the memory 830 or may output data from the memory 830 to an external device.

The controller 820 or the memory 830 may include semiconductor devices manufactured according to the present inventive concept.

The memory card 800 may be used as a data storage medium for a variety of portable devices. For example, the memory card 800 may be a multi media card (MMC) or a secure digital (SD) card.

Figure 12:
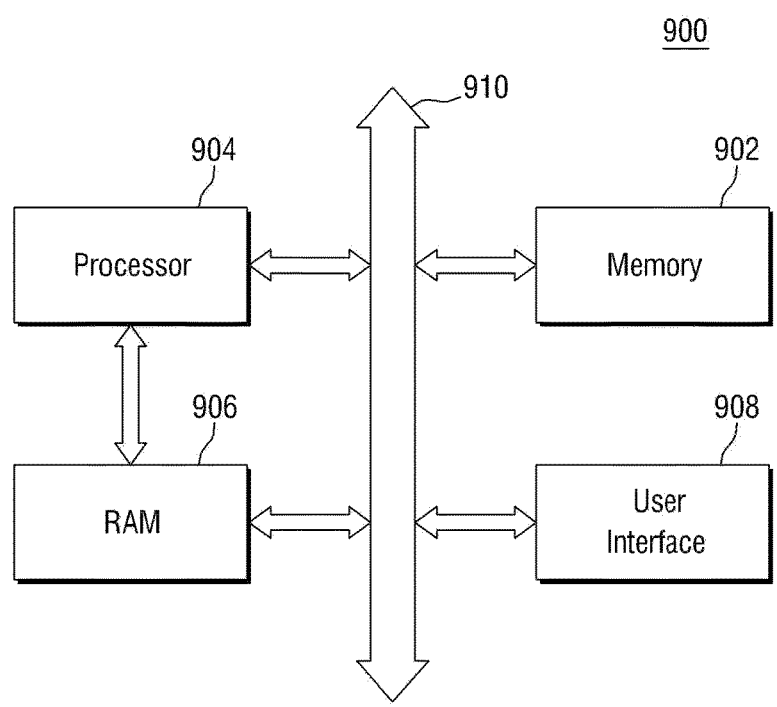
FIG. 12 is a block diagram illustrating an electronic system which may employ semiconductor packages fabricated according to the present inventive concept.

FIG. 12 is a block diagram illustrating an electronic system which emplys a 3D integrated circuit (semiconductor device) according to the present inventive concept are applied.

Referring to FIG. 12, the electronic system 900 may include a memory system 912, a processor 914, an RAM 916, and a user interface 918.

The memory system 912, the processor 914, the RAM 916, and the user interface 918 may perform data communication with one another through a bus 920.

The processor 914 may execute a program and may control the electronic system 900, and the RAM 916 can be used as a working memory of the processor 914. The processor 914 and the RAM 916 can each employ a semiconductor device manufactured according to the present inventive concept.

The user interface 918 may be used in inputting/outputting data to/from the electronic system 900. The memory system 912 may store codes for the operation of the processor 914, data processed by the processor 914 or externally input data.

The memory system 912 may include a separate driving controller and may be configured to additionally include an error correction block. The error correction block may be configured to detect errors of the data stored in the memory system 912 using an error correction code (ECC) and to correct the errors.

The memory system 912 may constitute a memory card. For example, the memory system 912 may constitute a PC card (for example, PCMCIA), a compact flash card (CF), a smart media card (SM/SMC), a memory stick, a multimedia card (for example, MMC, RS-MMC and MMCmicro), an SD card (for example, SD, miniSD and microSD), or a universal flash memory device (for example, UFS).

Figure 13:
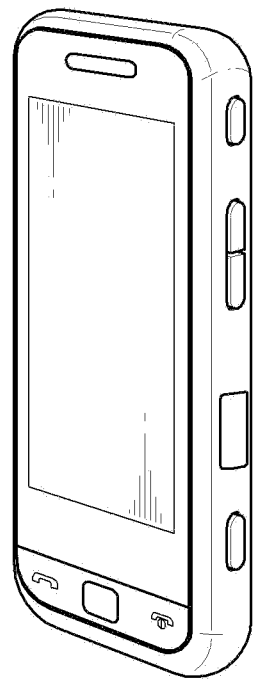
FIG. 13 illustrates the electronic system shown in FIG. 12 applied to a smart phone.

The electronic system 900 shown in FIG. 12 can be applied to electronic controllers of various electronic devices. FIG. 13 illustrates the electronic system shown in FIG. 12 applied to a smart phone. In this case, the electronic system (900 of FIG. 12) may be an application processor (AP), but the present inventive concept is not limited thereto.

In addition, the electronic system 900 may be provided as one of various components of an electronic device, examples of which include a computer, a portable computer, an ultra mobile personal computer (UMPC), a work station, a net-book, a personal digital assistant (PDA), a portable computer, a web tablet, a wireless phone, a mobile phone, a smart phone, an e-book, a portable multimedia player (PMP), a portable game console, a navigation device, a black box, a digital camera, a 3-dimensional (3D) television, a digital audio recorder, a digital audio player, a digital picture recorder, a digital picture player, digital video recorder, a digital video player, a device capable of transmitting/receiving information in wireless environments, one of various electronic devices constituting a home network, one of various electronic devices constituting a computer network, one of various electronic devices constituting a telematics network, RFID devices, or embedded systems.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A method of manufacturing a semiconductor device, the method comprising:
    determining a TSV candidate region in a first die and determining a TSV candidate region in a second die parallel to the first die;
    determining a first bound region horizontally encompassing a location of a pin of the first die and a location of a pin of the second die;
    calculating an area based on areas of overlap, as viewed in plan, between the first bound region and each of the first TSV candidate region and the second TSV candidate region; and
    fabricating a semiconductor device having the first and second dies stacked on each other, through silicon vias (TSVs) electrically connected to the first and second dies, respectively, and the first pin and the second pin connected to one of the TSVs based on the calculated area,
    wherein the determining of the first TSV candidate region comprises:
    laying out respective electronic devices of the first die at a spacing that the electronic devices would assume in a case in which the electronic devices were confined within the bounds of the first die and the electronic devices exerted repulsive forces on one another, wherein a magnitude of the repulsive force between any two adjacent ones of the electronic devices is proportional to the number of TSVs between the adjacent blocks, and
    assigning the region without the blocks of the electronic devices in the first die as the first TSV candidate region.

2. The method of claim 1, wherein the distance between any ith one of the electronic devices and a jth one of the electronic devices in the first die is proportional to the magnitude of a repulsive force between the electronic devices, conforming to Equations (1) and (2):

$$f(i,j)=1\times(a\times k_i\times b\times k_j)/r^2, \text{ where } r \text{ is not } 0 \quad (1)$$

$$f(i,j)=2\times l\times(a\times k_i\times b\times k_j), \text{ where } r \text{ is } 0 \quad (2)$$

where f(i, j) is a function of the magnitude of the repulsive force applied between the ith electronic device and the jth electronic device, l is an effective distance between the ith electronic device and the jth electronic device, r is the actual distance between the ith electronic device and the jth electronic device, $k_i$ is the number of TSVs required by the ith electronic device, $k_j$ is the number of TSVs required by the kth electronic device, and a and b are constants greater than or equal to 0.

3. A method of manufacturing a semiconductor device, the method comprising:
    determining a TSV candidate region in each of a plurality of dies, wherein each of the TSV candidate regions is a region available in each of the plurality of dies for connection to through silicon vias (TSVs);
    determining a bound region for each of a plurality of nets, wherein each of the nets includes the pins which are to be electrically connected in common to one of the TSVs, and each of the bound regions is a region encompassing a projection of locations of the pins constituting a respective one of the nets;
    calculating areas of overlap, as viewed in plan, between the bound region and the TSV candidate regions, respectively, for each of the nets;
    determining a routing order of the nets based on the areas of overlap calculated for the nets;
    routing the pins of the nets with the TSVs in the routing order; and
    fabricating a 3D integrated circuit having a stack of dies including pins, and TSVs electrically connecting respective ones of the dies to each other and to which the pins are electrically connected in conformance with the routing order.

4. The method of claim 3,
    wherein the determining of the routing order of the nets comprises determining the routing order such that among the nets, the net having a smaller value of Cost_net_ordering, as calculated by Equation (3), is first routed with a TSV:

$$\text{Cost\_net\_ordering}=a\times\min(\text{overlapping\_area})+b\times\text{total}(\text{overlapping\_area}) \quad (3)$$

where min(overlapping_area) is a minimum area among the areas of overlap calculated for the net, total(overlapping_area) is a total of the areas of overlap calculated for the net, and a and b are constants greater than or equal to 0.

5. The method of claim 3, wherein the determining of the routing order of the nets comprises:
    classifying the nets with pins in at least two different dies as a first group;
    classifying the nets with pins only in one of the dies as a second group; and
    determining the routing order such that the nets belonging to the first group are routed earlier than the nets belonging to the second group.

6. The method of claim 3, wherein the determining of the routing order of the nets comprises:
    generating a minimum spanning tree including nodes representing pins of the nets and the TSV candidate regions, and edges with weights assigned based on distances between the pins and cost congestion of the TSV candidate regions; and
    routing the pins of a net along a path having a minimum total of the weights as a routing path by traversing the minimum spanning tree.

7. The method of claim 6, wherein the cost congestion of the TSV candidate regions satisfies Equation (4):

$$\text{Congestion\_Cost}=(1/(1-C_k))-2 \quad (4)$$

where Congestion_Cost is the cost congestion of the TSV candidate regions, and $C_k$ is a ratio of the number of routed TSVs to the number of TSV candidates in the TSV candidate regions.

8. The method of claim 7, wherein the edges include a first edge indicating connection between pins on the same die, a second edge indicating connection between a top portion of a TSV and a pin connected to the top portion of the TSV, and a third edge indicating connection between a bottom portion of the TSV and a pin connected to the bottom portion of the TSV, and weights assigned to the first edge and the third edge satisfy Equation (5):

$$\text{Cost\_routing} = a \times \text{WL} + b \times \text{CC} \quad (5)$$

where Cost_routing is the weight assigned to each of the first edge and the third edge, WL is a wire length between pins, CC is the cost congestion of the TSV candidate regions, and a and b are constants greater than or equal to 0.

9. The method of claim 8, wherein the weight assigned to the second edge satisfies Equation (6):

$$\text{Cost\_routing\_Etp} = a \times (\text{WL} + c \times \text{nTSV}) + b \times (\text{CC} + \text{CC\_TSV}) \quad (6)$$

where Cost_routing_Etp is the weight assigned to the second edge, WL is the wire length between pins, nTSV is the number of the TSV candidates, CC is the cost congestion of the TSV candidate regions, CC_TSV is the cost congestion of the TSV candidates, and a and b are constants greater than or equal to 0.

10. The method of claim 6, further comprising:
if the routing is unsuccessful, deleting a routing result of the most recently successfully routed net among the nets having overlapped regions overlapping, in a plan view, with the overlapped regions of the unsuccessfully routed net; and
re-routing the most recently successfully routed net and the unsuccessfully routed net, checking if the result of the re-routing is successful, and when the re-routing is unsuccessful, re-routing the most recently successfully routed net and the unsuccessfully routed net in a different way.

11. The method of claim 10, wherein if the re-routing is unsuccessful for a predetermined number of times, further comprising:
changing a ratio of the distance between the pins and the cost congestion of the TSV candidate regions and recalculating the weights using the new ratio; and
performing the re-routing according to the recalculated weights.

12. A method of manufacturing a semiconductor device, the method comprising:
determining N TSV candidate regions for N dies having a plurality of pins and stacked in a vertical direction, where N is an integer greater than or equal to 2;
determining a first bound region horizontally encompassing locations of pins of a first net and a second bound region horizontally encompassing pins of a second net;
calculating a first area by summing all areas of overlap, as viewed in plan, between the first bound region and the N TSV candidate regions, and assigning the first area to the first net;
calculating a second area by summing all areas of overlap, as viewed in plan, between the second bound region and the N TSV candidate regions, and assigning the second area to the second net;
routing the nets with TSVs in an order based on their assigned areas; and
fabricating a 3D integrated circuit having a stack of dies including pins, and TSVs electrically connecting respective ones of the dies to each other and to which the pins are electrically connected in conformance with the routing order.

13. The method of claim 12, further comprising:
calculating a first minimum area by selecting a minimum value among the areas of overlapped regions between the first bound region and the N TSV candidate regions; and
calculating a second minimum area by selecting a minimum value among the areas of overlapped regions between the second bound region and the N TSV candidate regions,
wherein the first minimum area is assigned to the first net, and the second minimum area is assigned to the second net, and
the routing comprises routing the net with a smallest assigned minimum area, among the minimum areas, with a TSV before the other net is routed with a TSV.

14. The method of claim 12, further comprising:
classifying the nets into first and second groups,
wherein the nets with pins provided in at least two different ones of the dies are placed in the first group, and the nets with pins provided in only one of the dies are placed in the second group, and
wherein the routing comprises routing any of the nets belonging to the first group earlier than any of the nets belonging to the second group.

* * * * *